United States Patent
Eun

(10) Patent No.: US 8,003,489 B2
(45) Date of Patent: Aug. 23, 2011

(54) METHOD FOR FORMING ISOLATION LAYER IN SEMICONDUCTOR DEVICE

(75) Inventor: Byung-Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 17 days.

(21) Appl. No.: 11/965,533

(22) Filed: Dec. 27, 2007

(65) Prior Publication Data

US 2009/0068817 A1 Mar. 12, 2009

(30) Foreign Application Priority Data

Sep. 7, 2007 (KR) .......................... 10-2007-0091196

(51) Int. Cl.
*H01L 21/76* (2006.01)
(52) U.S. Cl. ........ 438/435; 438/221; 438/424; 257/374; 257/510; 257/E29.018; 257/E21.54; 257/E21.546
(58) Field of Classification Search .................. 438/221, 438/400, 222–224, 424–438, 700; 257/471, 257/374, 506, 501, E29.018, E29.02, E21.545, 257/E21.546, E21.548, E21.549, E21.55, 257/E21.551, E21.553
See application file for complete search history.

(56) References Cited

U.S. PATENT DOCUMENTS

| | | | | |
|---|---|---|---|---|
| 6,743,728 B2 * | 6/2004 | Ho et al. | ........................ | 438/700 |
| 6,914,015 B2 * | 7/2005 | Belyansky et al. | ........... | 438/788 |
| 7,332,409 B2 * | 2/2008 | Cha et al. | ........................ | 438/435 |
| 2002/0123206 A1 | 9/2002 | Hong et al. | | |
| 2003/0013271 A1 * | 1/2003 | Knorr et al. | .................... | 438/435 |
| 2003/0013272 A1 * | 1/2003 | Hong et al. | .................... | 438/437 |
| 2003/0194874 A1 * | 10/2003 | Ouchi | .......................... | 438/710 |
| 2004/0266133 A1 * | 12/2004 | Kim | ............................ | 438/424 |
| 2004/0266221 A1 * | 12/2004 | Kim | ............................ | 438/788 |
| 2005/0009293 A1 | 1/2005 | Kim et al. | | |
| 2005/0153519 A1 * | 7/2005 | Lu et al. | ......................... | 438/424 |
| 2005/0194646 A1 * | 9/2005 | Inoue et al. | .................... | 257/374 |
| 2006/0038254 A1 | 2/2006 | Jin | | |
| 2006/0068562 A1 | 3/2006 | Nanda et al. | | |
| 2006/0094201 A1 * | 5/2006 | Ryu | ............................ | 438/424 |
| 2006/0270183 A1 | 11/2006 | Kim et al. | | |
| 2007/0020877 A1 | 1/2007 | Tseng et al. | | |
| 2007/0212849 A1 * | 9/2007 | Ludwig et al. | ............... | 438/424 |

FOREIGN PATENT DOCUMENTS

| | | |
|---|---|---|
| JP | 2004-047851 | 2/2004 |
| KR | 1020020045401 A | 6/2002 |
| KR | 1020020061354 A | 7/2002 |
| KR | 1020050002317 A | 1/2005 |

* cited by examiner

*Primary Examiner* — Matthew Smith
*Assistant Examiner* — Su C Kim
(74) *Attorney, Agent, or Firm* — Kilpatrick Townsend & Stockton LLP

(57) ABSTRACT

A method for forming an isolation layer in a semiconductor device includes forming a trench in a semiconductor substrate. A flowable insulation layer is formed to fill the trench. The flowable insulation layer is recessed. A buried insulation layer is deposited on the flowable insulation layer while keeping a deposition sputtering rate (DSR) below about 22 so as to fill the trench with the buried insulation layer while restraining the buried insulation layer from growing on a lateral portion of the trench.

16 Claims, 14 Drawing Sheets

METHOD FOR FORMING ISOLATION LAYER IN SEMICONDUCTOR DEVICE

CROSS-REFERENCE TO RELATED APPLICATIONS

The priority of Korean patent application number 10-2007-0091196, filed on Sep. 7, 2007, which is incorporated by reference in its entirety, is claimed.

BACKGROUND OF THE INVENTION

The invention relates to a semiconductor device, and more particularly, to a method for forming an isolation structure to uniformly fill trenches of a semiconductor device so as to improve the characteristics of the semiconductor device.

Owing to the development of semiconductor manufacturing technology, very fine patterns can be formed in a semiconductor device using small design rules, and thus the integration level of the semiconductor device can be increased. In manufacturing a semiconductor memory device, such as a direct random access memory (DRAM) having very fine patterns, a device isolation process is important to increase the data retention time of the semiconductor memory device for improving the production yield. Thus, many processes and materials have been studied and developed based on the isolation process to improve the data retention time of a semiconductor device.

Among various isolation processes, a shallow trench isolation (STI) process is widely used since devices can be efficiently isolated using narrow trenches and an isolation layer. In the STI process, trenches are formed in a semiconductor substrate to a predetermined depth through typical exposure and etch processes, and the trenches are filled with an insulation layer. Then, a planarization process is performed on the insulation layer to form an isolation layer in the trenches. To improve gap-fill characteristics for filling trenches, a high density plasma (HDP) oxide layer is used as a gap-fill material or a deposition-etch-deposition (DED) method is used. However, the HDP oxide layer and the DED method are not suitable for filling trenches of a semiconductor device with sub-60 nm technology. In this case, trenches are filled with a flowable insulation layer formed of a compound including a solvent and a solute through a spin on dielectric (SOD) process.

In the SOD process using a flowable insulation layer, a compound including a solvent and a solute is applied to trenches using a coater to form a flowable insulation layer. Next, a curing process is performed to fill the trenches with the flowable insulation layer while densifying the flowable insulation layer. Then, the flowable insulation layer is recessed to a predetermined depth, and a trench isolation layer is formed in the trenches by filling the recessed portions of the flowable insulation layer with a buried insulation layer. However, the SOD process using a flowable insulation layer has many limitations such as the difficulty to uniformly fill the trenches with the trench isolation layer. Therefore, there is a need for an improved method for forming an isolation layer in a semiconductor device to obtain stabile device characteristics.

SUMMARY OF THE INVENTION

In one embodiment, there is provided a method for forming an isolation layer in a semiconductor device, the method including: forming a trench in a semiconductor substrate; forming a flowable insulation layer to fill the trench; recessing the flowable insulation layer; and depositing a buried insulation layer on the flowable insulation layer while keeping a deposition sputtering rate (DSR) below about 22 so as to fill the trench with the buried insulation layer while limiting growth of the buried insulation layer on a lateral portion (or sidewall) of the trench. As used herein, the term "trench" refers to the initial trench formed by etching as well as subsequent trenches that are defined within the initial trench as the layers are formed or provided therein.

After the recessing of the flowable insulation layer, the method further may further include forming a passivation layer to a predetermined thickness so as to protect an exposed lateral portion of the trench and prevent generation of a void at the lateral portion of the trench. The forming of the passivation layer may be performed using a high density plasma (HDP) process to a thickness of about 140 Å to about 180 Å.

The depositing of the buried insulation layer may be performed by supplying silane ($SiH_4$) gas at a flow rate of about 40 sccm to about 55 sccm and hydrogen ($H_2$) gas at a flow rate of about 1 sccm to about 40 sccm.

The depositing of the buried insulation layer may be performed by supplying silane ($SiH_4$) gas at a flow rate of about 10 sccm to about 20 sccm and hydrogen ($H_2$) gas at a flow rate of about 800 sccm to about 1100 sccm.

In another embodiment, there is provided a method for forming an isolation layer in a semiconductor device, the method including: forming a trench in a semiconductor substrate; forming a liner layer on an exposed surface of the trench, the liner layer including a liner nitride layer and a liner oxide layer; forming a flowable insulation layer to fill the trench; recessing the flowable insulation layer; loading the semiconductor substrate into a chamber; forming a passivation layer to a predetermined thickness by supplying a first deposition source including oxygen ($O_2$), silane ($SiH_4$), and helium (He) gases to the chamber for protecting a lateral surface of the liner nitride layer exposed when the flowable insulation layer is recessed and preventing generation of a void at a lateral portion of the trench; and depositing a buried insulation layer so as to fill the trench by supplying a second deposition source including oxygen ($O_2$), silane ($SiH_4$), hydrogen ($H_2$), and helium (He) gases to the chamber while keeping a DSR below about 22.

In still another embodiment, there is provided a method for forming an isolation layer in a semiconductor device, the method including: forming a trench in a semiconductor substrate; forming a liner layer on an exposed surface of the trench, the liner layer including a liner nitride layer and a liner oxide layer; forming a flowable insulation layer to fill the trench; recessing the flowable insulation layer; loading the semiconductor substrate into a chamber; forming a passivation layer to a predetermined thickness by supplying a first deposition source including oxygen ($O_2$), silane ($SiH_4$), and helium (He) gases to the chamber for protecting a lateral surface of the liner nitride layer exposed when the flowable insulation layer is recessed and preventing generation of a void at a lateral portion of the trench; and depositing a buried insulation layer so as to fill the trench by supplying a second deposition source including oxygen ($O_2$), silane ($SiH_4$), and hydrogen ($H_2$) gases to the chamber while keeping a DSR in a range from about 1 to about 7.

After the depositing of the buried insulation layer, the method may further include applying oxygen ($O_2$) plasma to the semiconductor substrate so as to remove hydrogen from a surface of the buried insulation layer by reacting oxygen ions with hydrogen ions.

The passivation layer may be formed to a thickness of about 250 Å to about 350 Å so as to protect the liner nitride layer when the buried insulation layer is deposited.

The depositing of the buried insulation layer may be performed by supplying the silane ($SiH_4$) gas to the chamber at a flow rate of about 10 sccm to about 20 sccm, and supplying the hydrogen ($H_2$) gas to the chamber from a lateral side of the chamber at a flow rate of about 600 sccm to about 800 sccm and from a topside of the chamber at a flow rate of about 200 sccm to about 300 sccm while maintaining the semiconductor substrate at a temperature of about 650° C. to about 750° C.

DESCRIPTION OF SPECIFIC EMBODIMENTS

Hereinafter, a method for forming an isolation structure in a semiconductor device in accordance with the invention will be described in detail with reference to the accompanying drawings, in which embodiments of the invention are shown. The invention may, however, be embodied in many different forms and should not be construed as being limited to the embodiments set forth herein.

Figure 1:
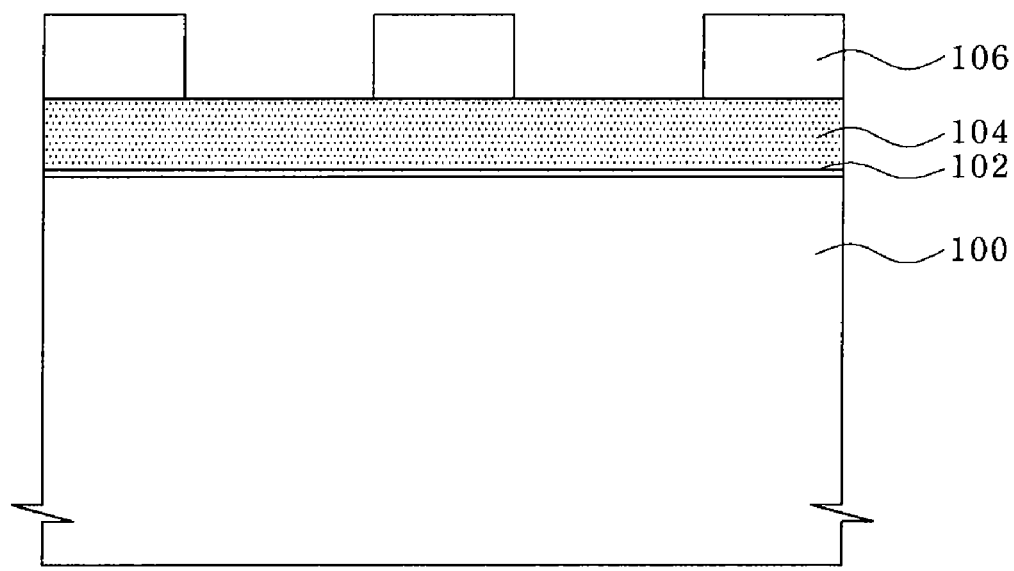
FIGS. 1 through 12 illustrate a method for forming an isolation layer in a semiconductor device according to an embodiment of the invention.

Referring to FIG. 1, a pad oxide layer 102 and a pad nitride layer 104 are sequentially deposited on a semiconductor substrate 100. The pad oxide layer 102 reduces stresses of the semiconductor substrate 100 caused by an attracting force exerted by the pad nitride layer 104. A photoresist layer is formed on the pad nitride layer 104 and is patterned to form a photoresist layer pattern 106 that selectively exposes the pad nitride layer 104. An isolation layer will be formed in exposed regions of the pad nitride layer 104 to define isolation regions, and the other regions of the pad nitride layer 104 covered with the photoresist layer pattern 106 will become active regions.

Figure 2:
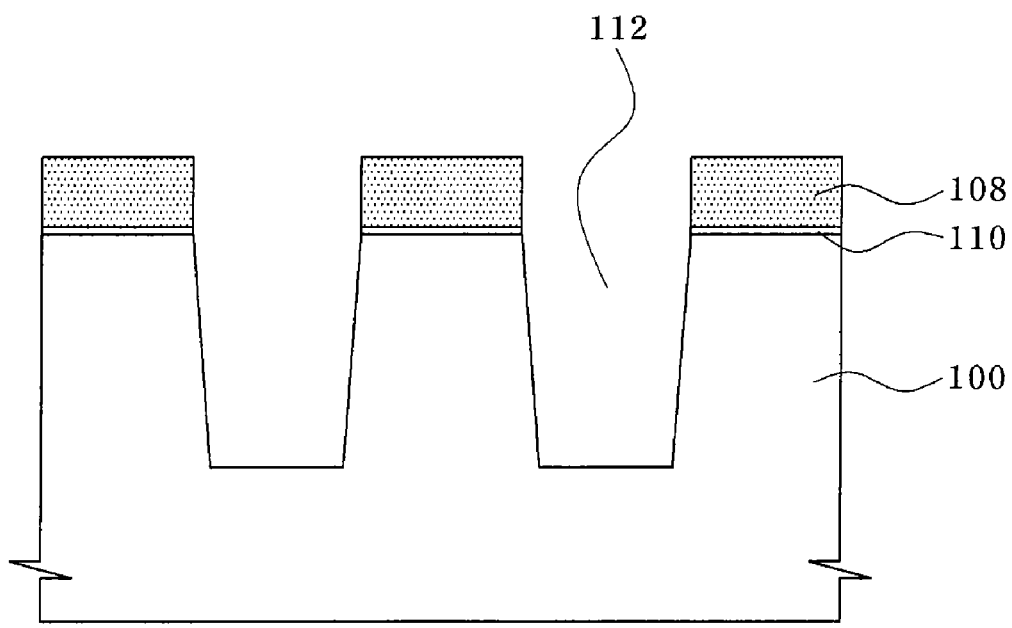

Referring to FIG. 2, an etch process is performed using the photoresist layer pattern 106 as a mask to form trenches 112 having a predetermined depth.

Specifically, the exposed regions of the pad nitride layer 104 are etched away using the photoresist layer pattern 106 to form a pad nitride layer pattern 108. Next, the photoresist layer pattern 106 is stripped (i.e., removed). Next, the pad oxide layer 102 is etched using the pad nitride layer pattern 108 to form a pad oxide layer pattern 110 that selectively exposes the semiconductor substrate 100. Then, exposed regions of the semiconductor substrate 100 are etched away using the pad nitride layer pattern 108 and the pad oxide layer pattern 110 as masks to form the trenches 112 in the semiconductor substrate 100 to a predetermined depth (e.g., about 1600 Å to about 1800 Å).

Figure 3:
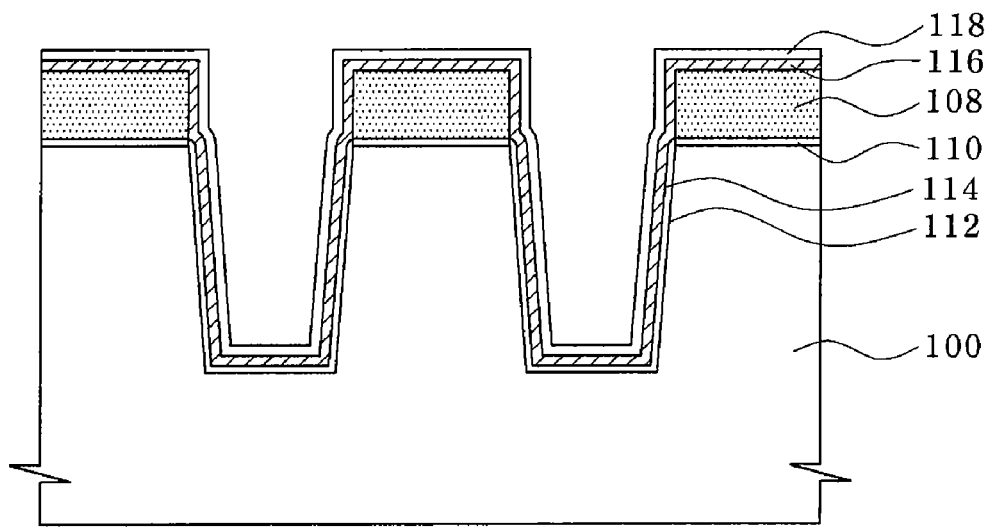

Referring to FIG. 3, an oxidation process is performed on the semiconductor substrate 100 to form a sidewall oxide layer 114 in the trenches 112. The sidewall oxide layer 114 can be formed by thermal oxidation. The semiconductor substrate 100 can be damaged during the formation of the trenches 112, and thus the sidewall oxide layer 114 is formed to compensate for the damaged portions of the semiconductor substrate 100. In addition, the sidewall oxide layer 114 prevents stresses that can be applied to the semiconductor substrate 100 by a liner nitride layer 116 when the liner nitride layer 116 is directly formed on the semiconductor substrate 100.

Next, the liner nitride layer 116 is deposited on the sidewall oxide layer 114 to a thickness of about 75 Å to about 80 Å. The liner nitride layer 116 prevents a leakage current caused by the semiconductor substrate 100 being permeated with an oxide source during a process such as a gate oxidation process and a thermal process. In addition, the liner nitride layer 116 prevents a decrease in threshold voltage Vth caused by an isolation layer being permeated with a dopant during an impurity implantation process for forming channels. Although a liner nitride layer is deposited to a thickness of about 70 Å or less in a conventional method, the liner nitride layer 116 is deposited to a thickness of about 75 Å to about 80 Å in the current embodiment of the invention. Since the liner nitride layer 116 has a sufficient thickness, the semiconductor substrate 100 can be protected from attacks in a later process. Thereafter, a liner oxide layer 118 is formed on the liner nitride layer 116.

Figure 4:
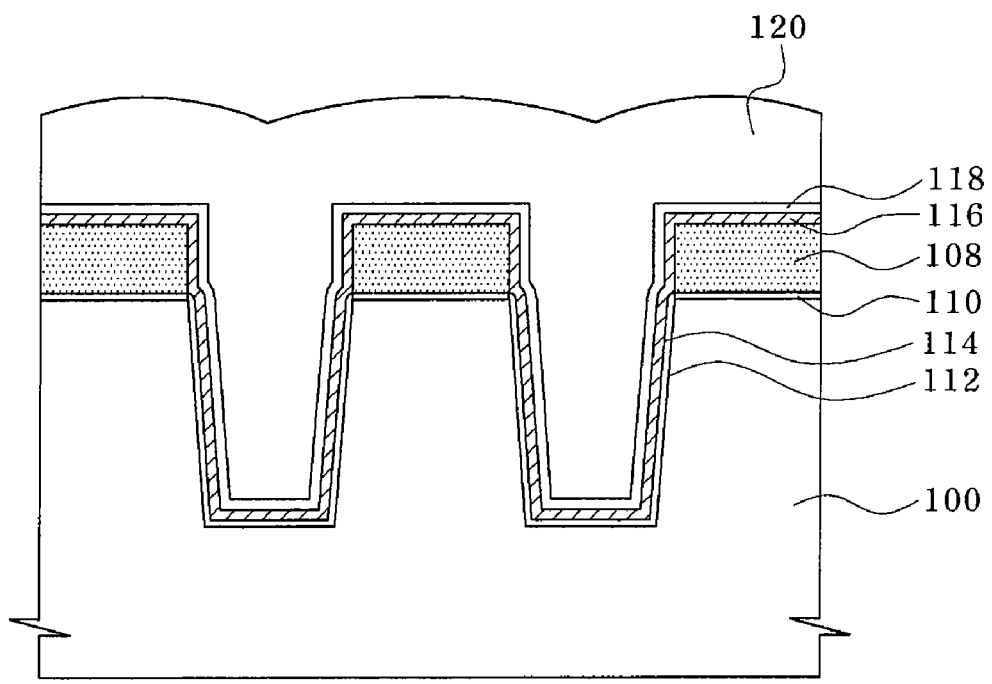

Referring to FIG. 4, a flowable insulation layer 120 is formed above the semiconductor substrate 100 to fill the trenches 112.

In detail, the semiconductor substrate 100 is loaded on a spin coater. Next, while rotating the spin coater, a compound including a solvent and a solute is applied to the semiconductor substrate 100 to form the flowable insulation layer 120 for filling the trenches 112. The flowable insulation layer 120 may be a spin on dielectric (SOD) layer having good reflow characteristics. For example, the flowable insulation layer 120 may be formed of polysilazane. Next, the flowable insulation layer 120 is treated by curing. The curing process can be performed in a hydrogen ($H_2$) or oxygen ($O_2$) atmosphere.

Figure 5:
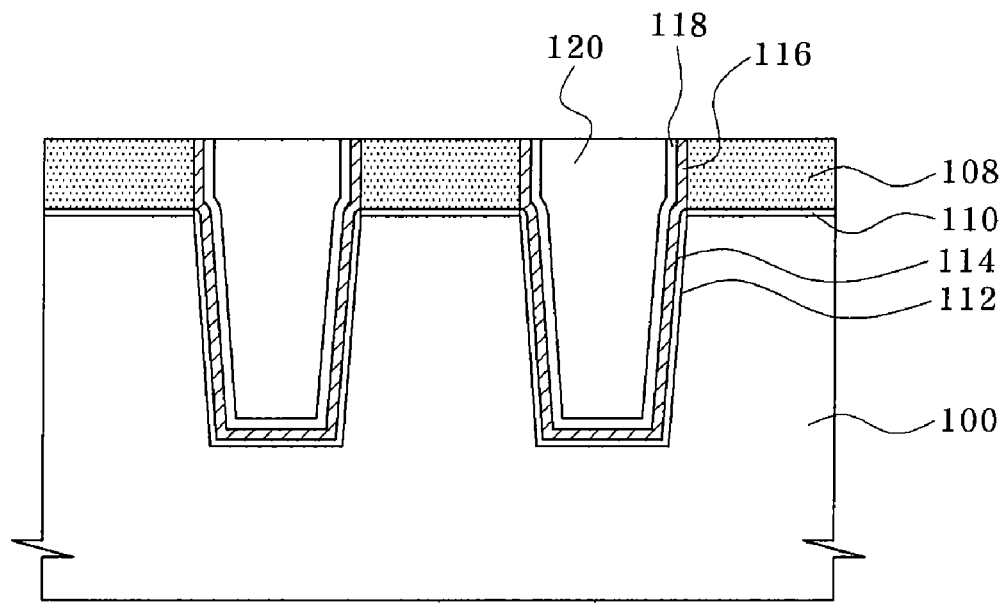

Referring to FIG. 5, a planarization process is performed on the flowable insulation layer 120. The planarization process is performed by chemical mechanical polishing (CMP) until the pad nitride layer pattern 108 is exposed. Owing to the planarization process, the flowable insulation layer 120 can be uniformly recessed in a later process.

Figure 6:
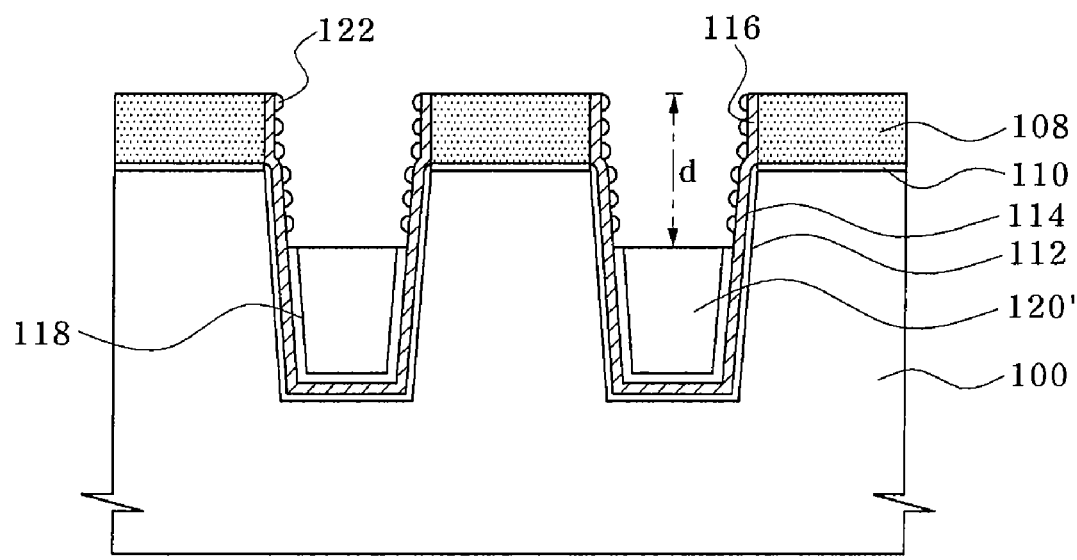

Referring to FIG. 6, after the planarization process, the flowable insulation layer 120 is recessed to a predetermined depth (d) to expose the liner nitride layer 116. The predetermined depth (d) may range from about 1100 Å to about 1500 Å. The flowable insulation layer 120 can be recessed using a wet etch chemical such as a hydrofluoride (HF) solution. After the flowable insulation layer 120 is recessed, the flowable insulation layer 120 is denoted by reference numeral 120'. While the flowable insulation layer 120 is recessed, the liner oxide layer 118 is etched away to the predetermined depth (d). Therefore, the liner nitride layer 116 can be exposed to the same predetermined depth (d). In addition, while the flowable insulation layer 120 is recessed, exposed portions of the liner nitride layer 116 can be etched away. As a result, the thickness of the exposed portions of the liner nitride layer 116 can be reduced. Next, an annealing process is performed on the semiconductor substrate 100. In detail, the semiconductor substrate 100 is loaded in a furnace and is annealed at a temperature of about 900° C. to about 950° C. for about 20 seconds to about 30 seconds in order to densify the flowable insulation layer 120'.

In a conventional method, deposition of a buried insulation layer and etching of the buried insulation layer are repeated to uniformly fill trenches. However, as the integration level of semiconductor devices increases, much deeper and narrower trenches are formed in a semiconductor device, and thus it is difficult to efficiently fill the trenches only with a buried insulation layer. For this reason, in the current embodiment of the invention, the flowable insulation layer 120 is used to fill the trenches 112. In detail, the flowable insulation layer is formed on the semiconductor substrate 100 in which the trenches 112 are formed, and the flowable insulation layer 120 is recessed. In this way, portions of the narrow trenches 112 are first filled with the flowable insulation layer 120, and then the remaining portions of the trenches 120 are filled with a buried insulation layer.

However, while the flowable insulation layer 120 is recessed, the liner oxide layer 118 is also etched away, and thus portions of the liner nitride layer 116 exposed through the trenches 112 can increase in roughness to form rough portions 122 on lateral surfaces (or the upper sidewalls) of the trenches 112. For example, portions of the liner oxide layer 118 which are not etched away can remain on the exposed portions of the liner nitride layer 116 to form the rough portions 122. The roughnesses of the rough portions 122 can increase as the wet etch process time for recessing the flowable insulation layer 120 increases.

Figure 14:
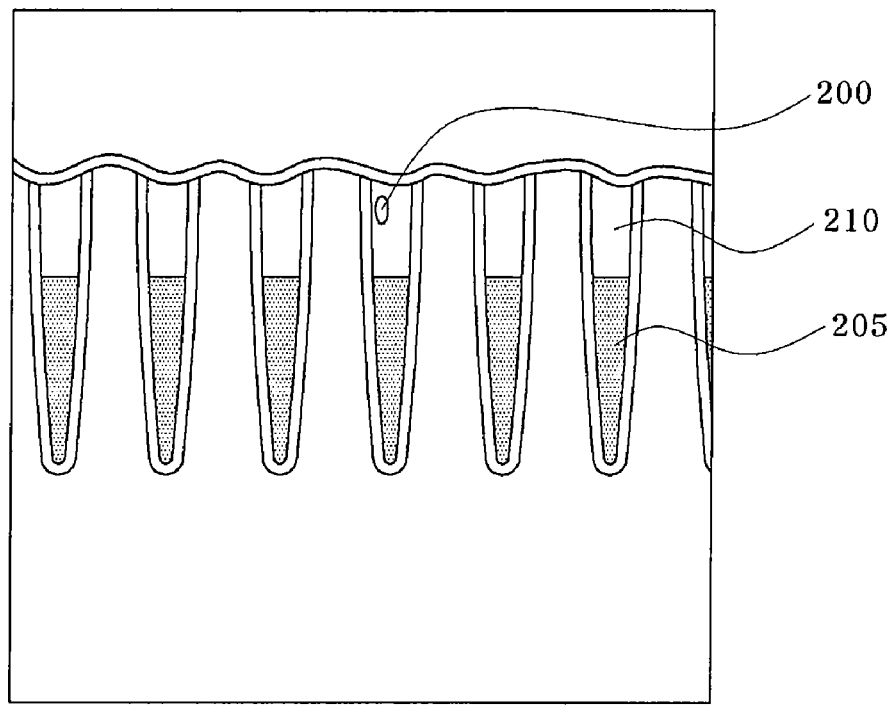
FIGS. 14 and 15 illustrate problems occurring when an isolation layer is formed.
Figure 15:
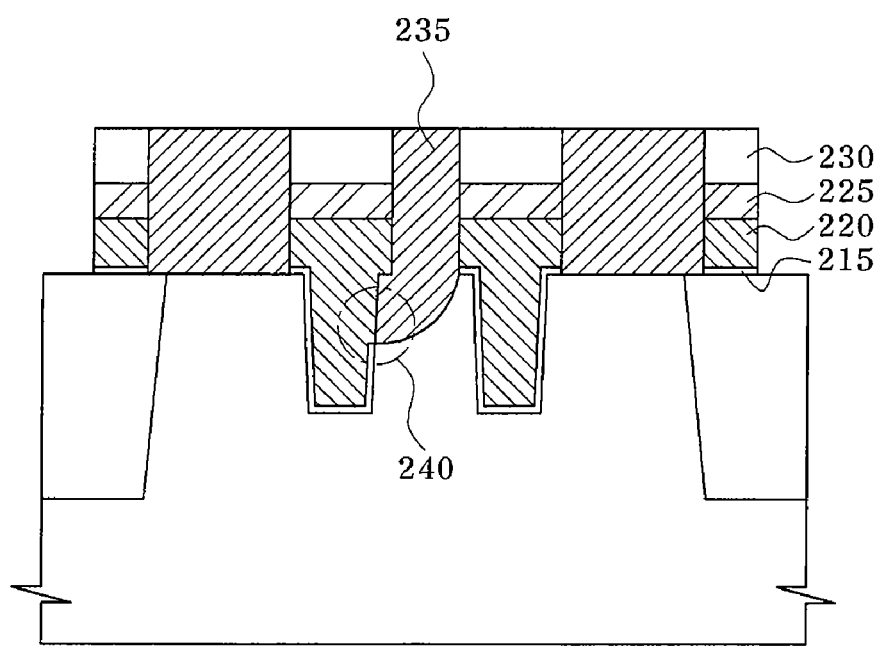

If a buried insulation layer is formed directly in the trenches 112 where the rough portions 122 exist, the growth rate of the buried insulation layer may be higher at lateral portions (or the sidewalls) of the trenches 112 where the rough portions 122 exist than at the bottom of the trenches 112. In this case, the roughness of the rough portions 122 increases, and thus nano voids 200 (refer to FIG. 14) may be formed at interfaces between the rough portions 122 of the trenches 112 and the buried insulation layer growing in the trenches as shown in FIG. 14. In FIG. 14, reference numerals 205 and 210 denote a flowable insulation layer and a buried insulation layer. Moreover, if a subsequent process is performed when the nano voids 200 exist at the sidewalls of the trenches 112 after the buried insulation layer is formed, for example, a process of forming a gate electrode 220 and a landing plug 235 connected between a gate stack and a top electrode as shown in FIG. 15, conductive material from the landing plug 235 can permeate into the nano voids 200, and thus the landing plug 235 can be electrically connected to the gate electrode 220 (a bridge defect) as indicated by portion 240 in FIG. 15. In FIG. 15, reference numerals 215, 225, and 230 denote a gate insulation layer, a metal layer, and a hard mask layer, respectively.

The nano voids 200 (resulting in defects such as a bridge defect) are caused by the rough portions 122 formed by remaining particles of the liner oxide layer 118 on the liner nitride layer 116. In the case where the liner oxide layer 118 is not formed to prevent generation of the nano voids 200, the liner nitride layer 116 can be damaged by a wet etch chemical when the flowable insulation layer 120 is recessed, and thus a semiconductor device can be defective.

Thus, a method of using a deposition sputtering ratio (DSR) is used as a way of preventing generation of nano voids at the sidewall of trenches. The DSR denotes a ratio of a net deposition thickness of a target layer to an etching thickness of the target layer. The DSR can be calculated by dividing the sum of a deposition thickness and a sputtering thickness by the sputtering thickness as shown in Equation 1 below. When the DSR is high, the deposition thickness is relatively larger than the sputtering thickness. As the DSR becomes lower, a sputtering rate increases.

DSR=Deposition thickness+Sputtering thickness/ Sputtering thickness  [Equation 1]

In general, when the DSR is low, generation of nano voids can be prevented since a layer grows faster in a trench bottom than on a sidewall of the trench. However, when the DSR is low, a liner nitride layer can be cut (a clipping attack phenomenon) since the thickness of an oxide layer deposited on a lateral portion of a trench is low in a region where a trench wider than a cell region such as a peripheral region. Such a clipping attack can result in a gate oxide integrity (GOI) defect which can deteriorate the reliability of a semiconductor device. On the other hand, when the DSR is high, a clipping attack can be prevented. However, in this case, nano voids can be formed since a layer grows faster on a sidewall of a trench than in the trench. Therefore, there is a need for a method of preventing generation of a clipping attack in a peripheral region while allowing a layer to grow faster in a trench than on a sidewall of the trench.

Figure 7:
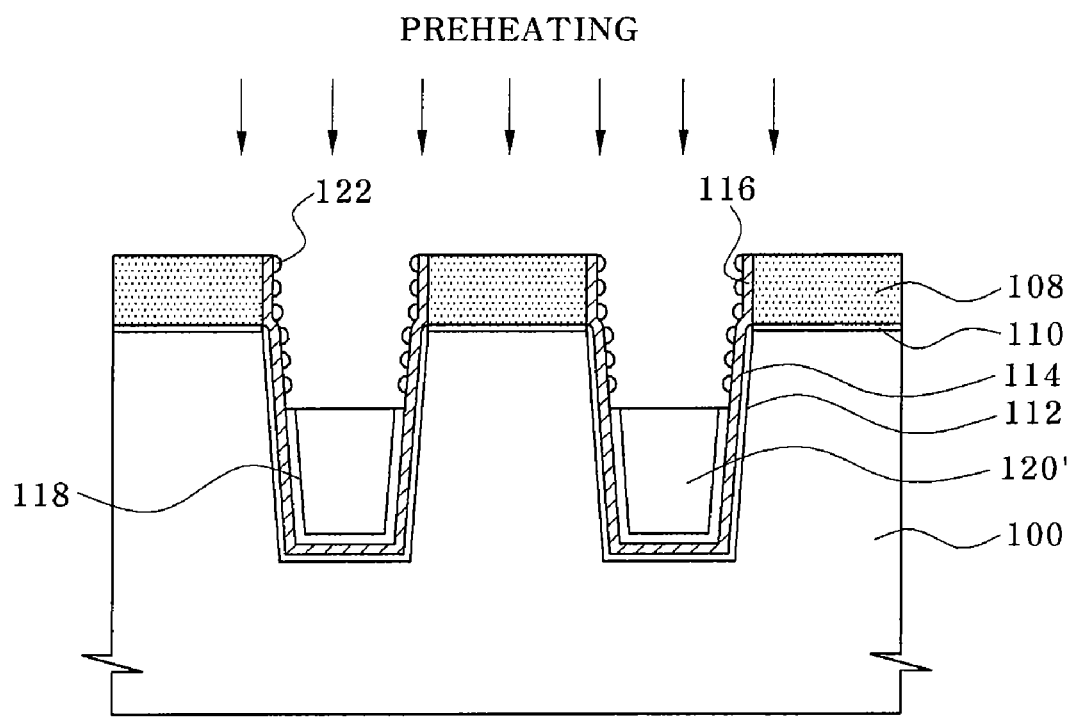
Figure 13:
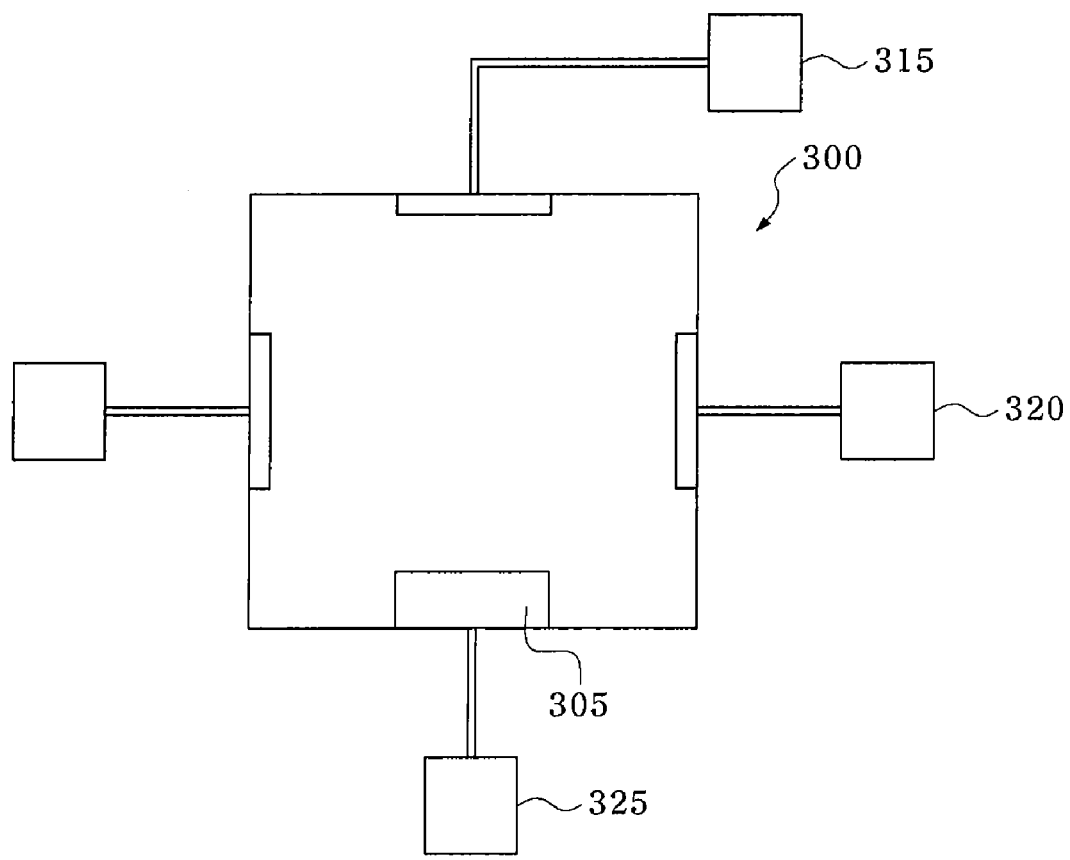
FIG. 13 illustrates a schematic view of a high density plasma (HDP) chamber according to an embodiment of the invention.

Referring to FIGS. 7 and 13, the semiconductor substrate 100 is treated through first and second preheating processes to reduce stresses in the sidewall oxide layer 114 and the liner nitride layer 116.

In detail, the semiconductor substrate 100 is loaded on a stage 305 of an HDP chamber 300 shown in FIG. 13 for performing a HDP process. Next, while injecting argon (Ar) and helium (He) gases to the HDP chamber 300, a predetermined power (or a bias voltage) is supplied to the HDP chamber 300 to perform a first preheating process for about 50 seconds to about 55 seconds. During the first preheating process, the argon (Ar) gas may be supplied to the HDP chamber 300 at a flow rate of about 60 sccm to 75 sccm. The helium (He) gas may be supplied to the HDP chamber 300 from lateral sides 320 at a flow rate of about 250 sccm to 350 sccm, and from a topside 315 at a flow rate of about 250 sccm to 350 sccm. Further, power ranging from about 4500 W to about 5500 W may be supplied to the HDP chamber 300 from the topside 315, and power ranging from about 3500 W to about 4500 W may be supplied to the HDP chamber 300 from the lateral sides 320 to generate plasma in the HDP chamber 300. No power is supplied to the HDP chamber 300 from a bottom side 325.

Next, a second preheating is performed on the semiconductor substrate 100. The second preheating process is performed for about 5 seconds to about 10 seconds by supplying inert gases including oxygen ($O_2$), argon (Ar), and helium (He) gases to the semiconductor substrate 100 and supplying a predetermined power (or a bias voltage) to the HDP chamber 300. The oxygen ($O_2$) gas may be supplied to the HDP chamber 300 at a flow rate of about 50 sccm to about 150 sccm, and the argon (Ar) gas may be supplied to the HDP chamber 300 at a flow rate of about 40 sccm to about 50 sccm. The helium (He) gas may be supplied to the HDP chamber 300 at a flow rate of about 200 sccm to about 300 sccm. Power may be supplied to the HDP chamber 300 from the topside 315 in the range from about 4500 W to about 5500 W, and power may be supplied to the HDP chamber 300 from the lateral sides 320 in the range from about 3500 W to about 4500 W. No power is supplied to the HDP chamber 300 from the bottom side 325. The first and second preheating processes may be performed for no more than sixty seconds. Stresses of the liner nitride layer 116 can be released during the first and second preheating processes, and thus the liner nitride layer 116 can be prevented from lifting from the trenches 112.

The first preheating process is performed without using oxygen ($O_2$) gas, and the second preheating process is performed using oxygen ($O_2$) gas. Thus, owing to the first and second preheating processes, stresses of the liner nitride layer 116 can be released, and exposed surfaces of the liner nitride layer 116 can be oxidized to form a protective oxide layer.

Figure 8:
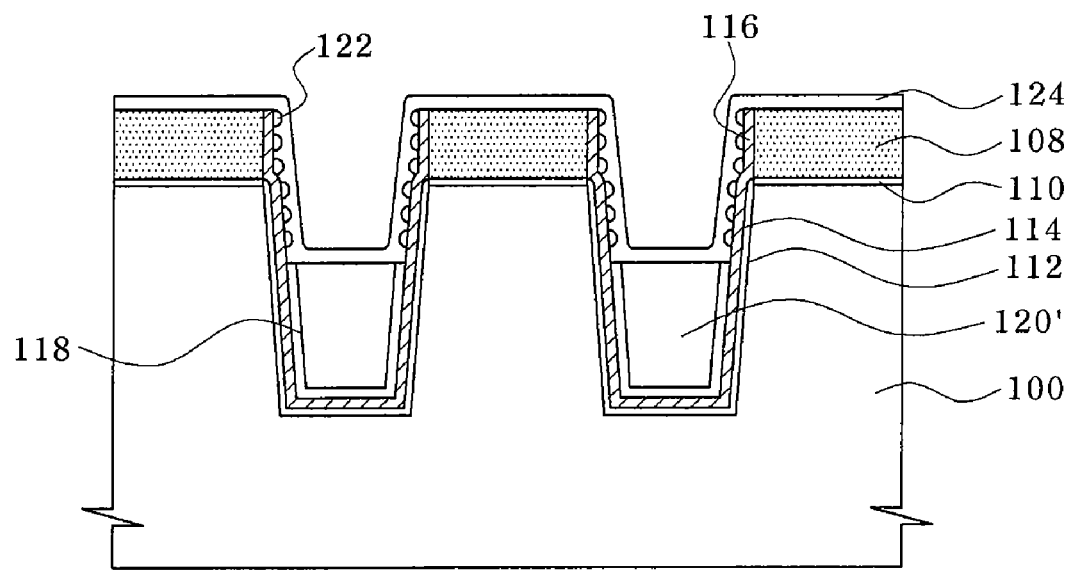

Referring to FIGS. 8 and 13, a passivation layer 124 is formed in the trenches 112 to cover exposed surfaces of the flowable insulation layer 120' and the liner nitride layer 116.

In detail, after the first and second preheating processes, a first deposition source including oxygen ($O_2$), silane ($SiH_4$), and helium (He) gases is supplied to the HDP chamber 300. The oxygen ($O_2$) gas may be supplied to the HDP chamber 300 at a flow rate of about 100 sccm to about 115 sccm. The silane ($SiH_4$) gas may be supplied to the HDP chamber 300 from the lateral sides 320 at a flow rate of about 40 sccm to about 55 sccm and from the topside 315 at a flow rate of about 25 sccm to about 35 sccm. The helium (He) gas may be supplied to the HDP chamber 300 from the lateral sides 320 at a flow rate of about 150 sccm to about 250 sccm and from the topside 315 at a flow rate of about 50 sccm to about 150 sccm. Power may be supplied to the HDP chamber 300 from the topside 315 in the range from about 7500 W to about 8500 W, and power may be supplied to the HDP chamber 300 from the lateral sides 320 in the range from about 4500 W to about 5500 W. Further, power may be supplied to the HDP chamber 300 in the range from about 450 W to about 550 W. The powers may be supplied to the HDP chamber 300 for about one second.

The passivation layer 124 functions as a glue layer when the trenches 112 are filled with a buried insulation layer. Further, the passivation layer 124 protects the liner nitride layer 116 from an etch gas. The passivation layer 124 has a thickness such that the roughness of the rough portions 122 (formed when the flowable insulation layer 120 is recessed) can be reduced, and generation of voids at the sidewalls of the trenches 112 can be prevented (i.e., proximate the sidewalls where materials are being formed/deposited). The passivation layer 124 can have a thickness of about 140 Å to about 180 Å. For example, the passivation layer 124 can have a thickness of about 160 Å.

In the conventional method, the passivation layer 124 may be deposited at a high frequency to a thickness of about 300 Å so as to prevent an attack by a high bias voltage applied to the semiconductor substrate 100 during a subsequent gap-fill process for filling the trenches 112. However, in this case, a DSR has a high value of about 280, and thus the passivation layer 124 can have a relatively large thickness at the rough portions 122 formed at the sidewalls of the trenches 112. As a result, when a buried insulation layer is formed in the trenches 112 in a subsequent process, the buried insulation layer may grow faster at the rough portions 122 than other portions which generate nano voids at the sidewalls of the trenches 112. For this reason, in the current embodiment of the invention, the passivation layer 124 is deposited to a thickness smaller than 300 Å, for example, a thickness of about 140 Å to about 180 Å, so as to prevent generation of nano voids at the sidewalls of the trenches 112.

Figure 9:
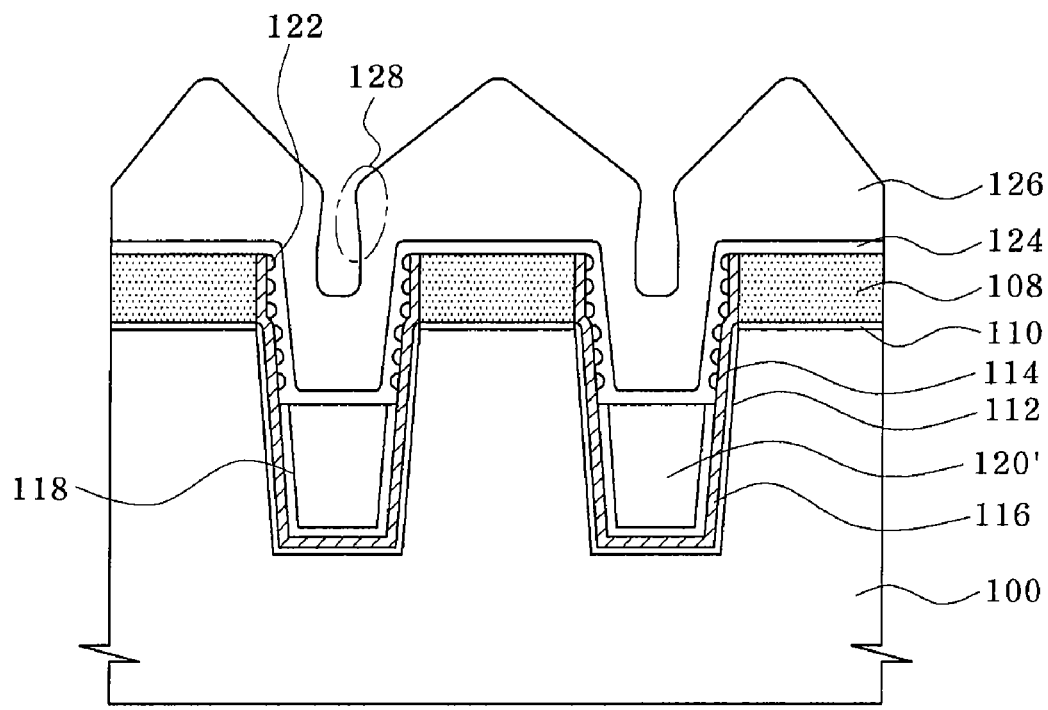

Referring to FIGS. 9 and 13, an HDP deposition source is supplied to the HDP chamber 300 to perform a first deposition process for forming a first HDP oxide layer 126.

In detail, a second deposition source including oxygen ($O_2$), silane ($SiH_4$), hydrogen ($H_2$), and helium (He) gases is supplied to the HDP chamber 300. The oxygen ($O_2$) gas may be supplied to the HDP chamber 300 at a flow rate of about 60 sccm to about 80 sccm. The silane ($SiH_4$) gas may be supplied to the HDP chamber 300 from the lateral sides 320 at a flow rate of about 25 sccm to about 38 sccm and from the topside 315 at a flow rate of about 15 sccm to about 25 sccm. The helium (He) gas may be supplied to the HDP chamber 300 from the lateral sides 320 at a flow rate of about 200 sccm to about 400 sccm. The hydrogen ($H_2$) gas may be supplied to the HDP chamber 300 at a flow rate of about 1 sccm to about 40 sccm. Power may be supplied to the HDP chamber 300 from the topside 315 in the range from about 6500 W to about 7500 W, and power may be supplied to the HDP chamber 300 from the lateral sides 320 in the range from about 6500 W to about 7500 W. Furthermore, power may be supplied to the HDP chamber 300 from the bottom side 325 in the range from about 1700 W to about 2200 W. In this way, the first HDP oxide layer 126 is formed on the passivation layer 124 to a thickness of about 1300 Å to about 2000 Å.

Figure 16A:
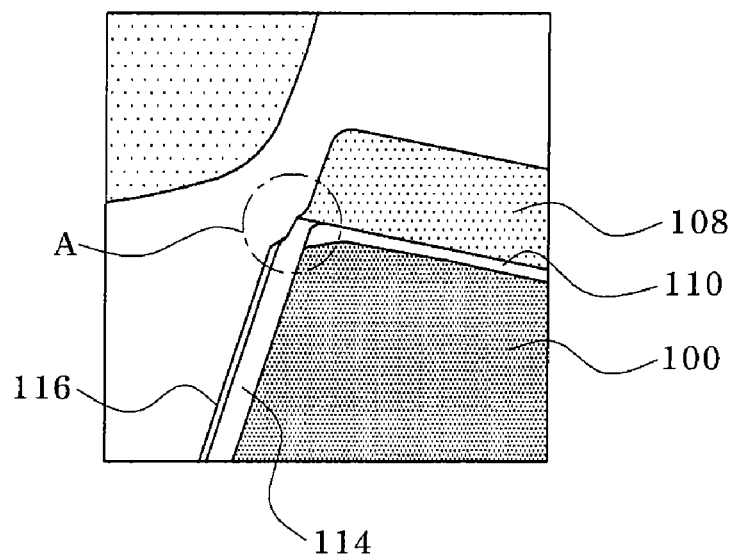
FIGS. 16A and 16B illustrate a clipping attack on a liner nitride layer.
Figure 16B:
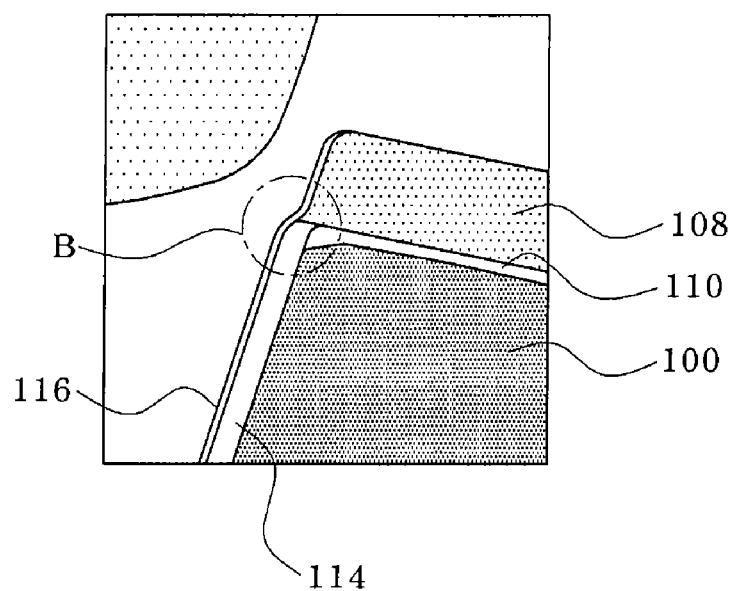

The first HDP oxide layer 126 may be formed while supplying the oxygen ($O_2$) and silane ($SiH_4$) gases at an oxygen to silane supply ratio of 1.4:1 and maintaining a DSR between about 18 to about 22. In a conventional method, when the first HDP oxide layer 126 is formed, the hydrogen ($H_2$) gas may be supplied to the HDP chamber 300 at a flow rate of about 120 sccm to about 130 sccm to maintain a DSR at about 38. However, in the current embodiment of the invention, the hydrogen ($H_2$) gas of the second deposition source is supplied to the HDP chamber 300 at a relatively low flow rate of about 1 sccm to about 40 sccm as compared with the conventional method, and other gases are supplied to the HDP chamber 300 at the same flow rates as in the conventional method. In this case, the DSR can be reduced to about 20. That is, since the flow rate of the hydrogen ($H_2$) gas is proportional to a deposition rate and reversely proportional to a sputtering (etching) rate, the DSR varies in proportion to the flow rate of the hydrogen ($H_2$) gas. Therefore, the sputtering rate can be reduced by decreasing the flow rate of the hydrogen ($H_2$) gas in order to decrease the DSR. When the DSR is low, a buried insulation layer grows faster on the bottom of the trenches 112 than on the sidewalls of the trenches 112 where the rough portions 122 are formed so that generation of nano voids can be effectively prevented. Meanwhile, when the DSR is low, the liner nitride layer 116 formed in a peripheral region can be cut by a clipping defect (A) as shown in FIG. 16A. Thus, in the current embodiment of the invention, the liner nitride layer 116 is formed to a thickness of about 75 Å to about 80 Å to dampen a clipping attack as shown in section B of FIG. 16B. Meanwhile, when the first HDP oxide layer 126 is formed in the trenches 112, overhangs 128 can be formed on the first HDP oxide layer 126 at upper portions of the trenches 112 since the trenches 112 are narrow.

Figure 10:
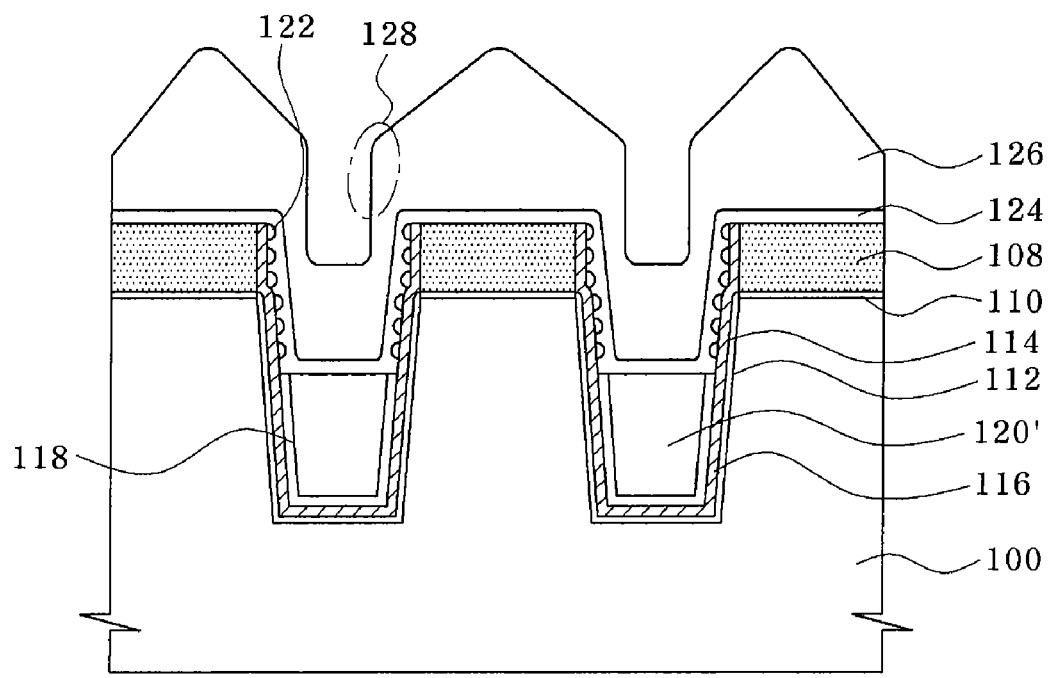

Referring to FIG. 10, an etch gas is supplied to the HDP chamber 300 to etch away the overhangs 128 of the first HDP oxide layer 126 from the upper portions of the trenches 112.

In detail, a fluorine based etch gas is supplied to the HDP chamber 300 to etch away a thickness of about 90 Å to about 140 Å of the first HDP oxide layer 126. The etch gas may include nitrogen trifluoride ($NF_3$), hydrogen ($H_2$), and helium (He) gases. While supplying the etch gas to the HDP chamber 300, a predetermined power is also supplied to the HDP chamber 300. The nitrogen trifluoride ($NF_3$) gas may be supplied to the HDP chamber 300 at a flow rate of about 100 sccm to about 130 sccm, and the helium (He) gas may be supplied to the HDP chamber 300 at a flow rate of about 180 sccm to about 230 sccm. Here, the helium (He) gas may be additionally supplied to the HDP chamber 300 from the topside 315 at a flow rate of about 40 sccm to 70 sccm. As source powers to generate plasma in the HDP chamber 300, power may be supplied to the HDP chamber 300 from the topside 315 in the range from about 1700 W to about 2200 W, and power may be supplied to the HDP chamber 300 from the lateral sides 320 in the range from about 4700 W to about 5300 W. In addition, power may be supplied to the HDP chamber 300 from the bottom side 325 in the range from about 1100 W to about 1400 W. In this way, the overhangs 128 can be removed from the upper portions of the trenches 112 by etching away a predetermined thickness of the first HDP oxide layer 126 so that a subsequent gap-fill process can be easily performed.

Figure 11:
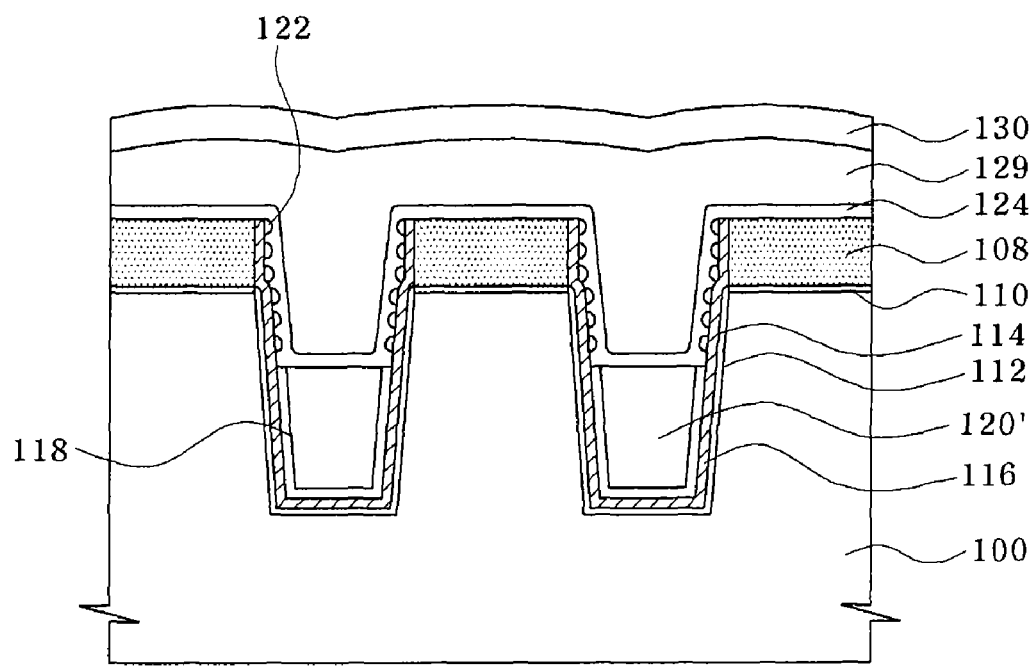

Referring to FIG. 11, an HDP deposition source is supplied to the semiconductor substrate 100 to form a second HDP oxide layer 129 for filling the trenches 112. The second HDP oxide layer 129 may be formed to a thickness of about 650 Å to about 850 Å. A capping layer 130 is additionally formed on the second HDP oxide layer 129. The second HDP oxide layer 129 may be formed in the same process conditions as those for the first HDP oxide layer 126.

Figure 12:
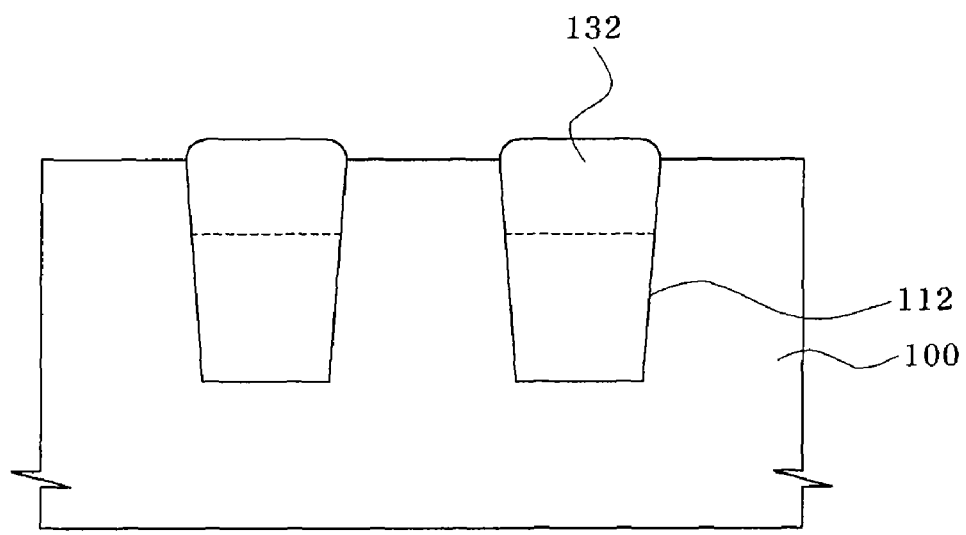

Referring to FIG. 12, an isolation layer 132 is formed by planarizing the capping layer 130 and the second HDP oxide layer 129 to expose the pad nitride layer pattern 108 and removing the exposed pad nitride layer pattern 108 and the pad oxide layer pattern 110. The capping layer 130 and the second HDP oxide layer 129 can be planarized by chemical mechanical polishing (CMP).

As explained above, in the current embodiment of the invention, the trenches 112 are filled by depositing the first HDP oxide layer 126, etching away the overhangs 128 of the first HDP oxide layer 126, and depositing the second HDP oxide layer 129. However, the deposition and etching processes for filling the trenches 112 can be varied to improve gap-fill characteristics.

In detail, in the above-described embodiment, the first HDP oxide layer 126 is first deposited to a thickness of about 1300 Å to 2000 Å, and an etch process is performed to remove the overhangs 128 formed on the first HDP oxide layer 126 at the upper portions of the trenches 112. However, alternatively, the trenches 112 can be filled by repeated forming of an HDP oxide layer having a thickness of about 800 Å and removing a thickness of about 90 Å to about 140 Å of the HDP oxide layer. This cycle may be repeated one to three times. In this case, overhangs of the HDP oxide layer can be efficiently removed, and thus a gap-fill margin can be improved.

Figure 18:
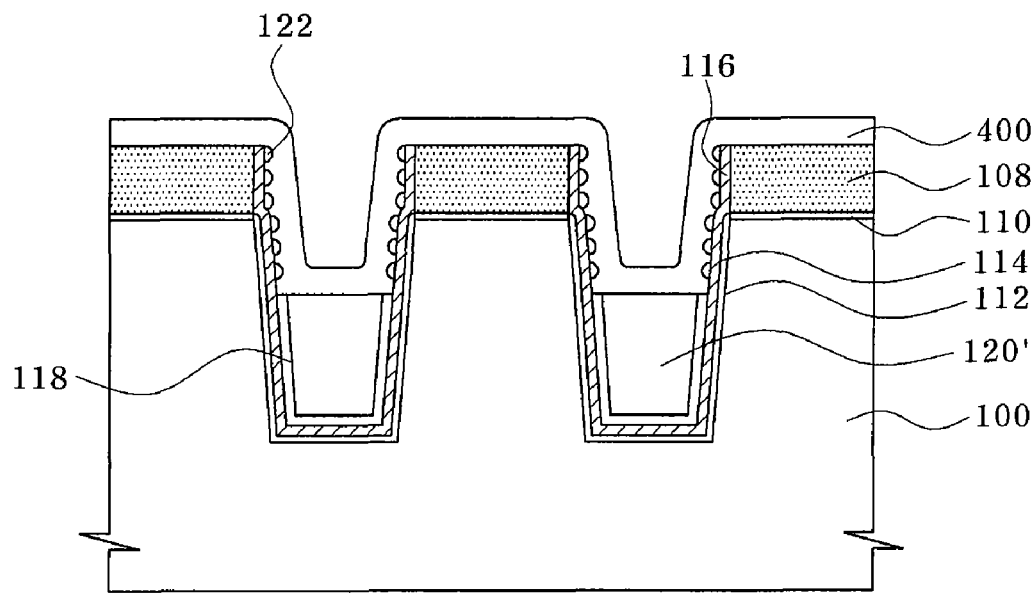
Figure 19:
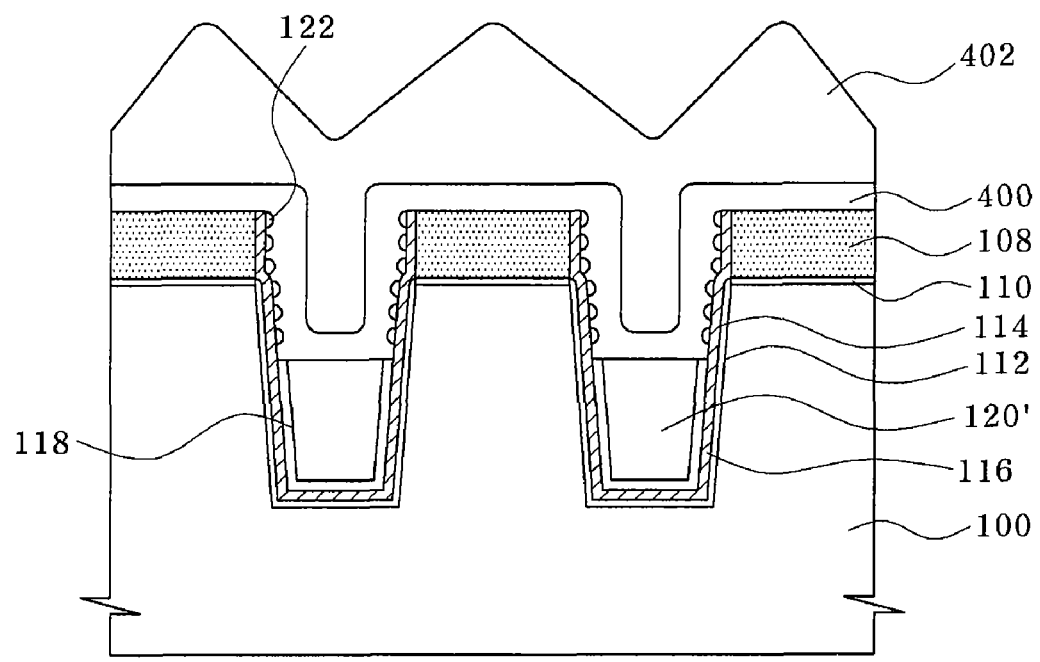
Figure 20:
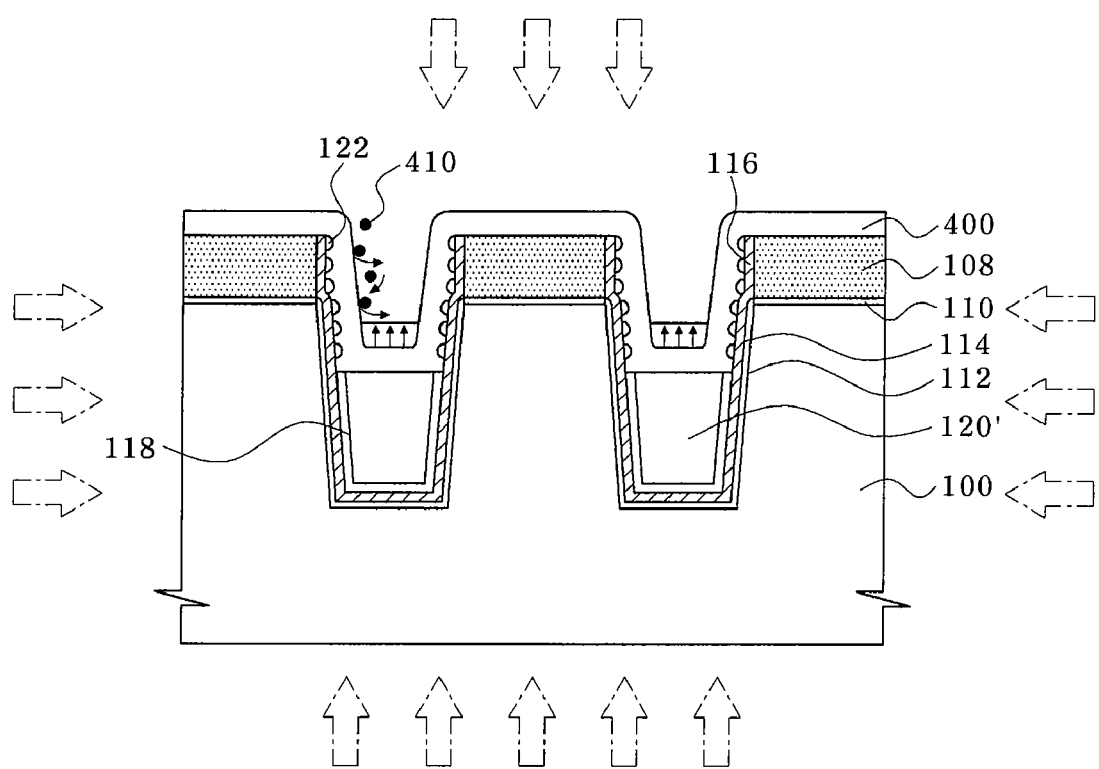

FIGS. 17 through 22 illustrate another embodiment of the invention. Particularly, FIG. 20 illustrates desorption of an oxide source caused by an increase of the temperature of a semiconductor substrate. FIGS. 23A and 23B illustrate inspection results of wafers.

As explained above in FIGS. 1 through 6, trenches 112 are formed in a semiconductor substrate 100. Next, a sidewall oxide layer 114, a liner nitride layer 116, and a liner oxide layer 118 are formed in the trenches 112. Next, the trenches 112 are filled with a flowable insulation layer 120, and the flowable insulation layer 120 is recessed using a wet etch chemical to a predetermined depth (d) to form a flowable insulation layer 120' that fills the bottom of the trenches 112. While the flowable insulation layer 120 is recessed, rough portions 122 are formed at the upper sidewalls of the trenches 112.

Figure 17:
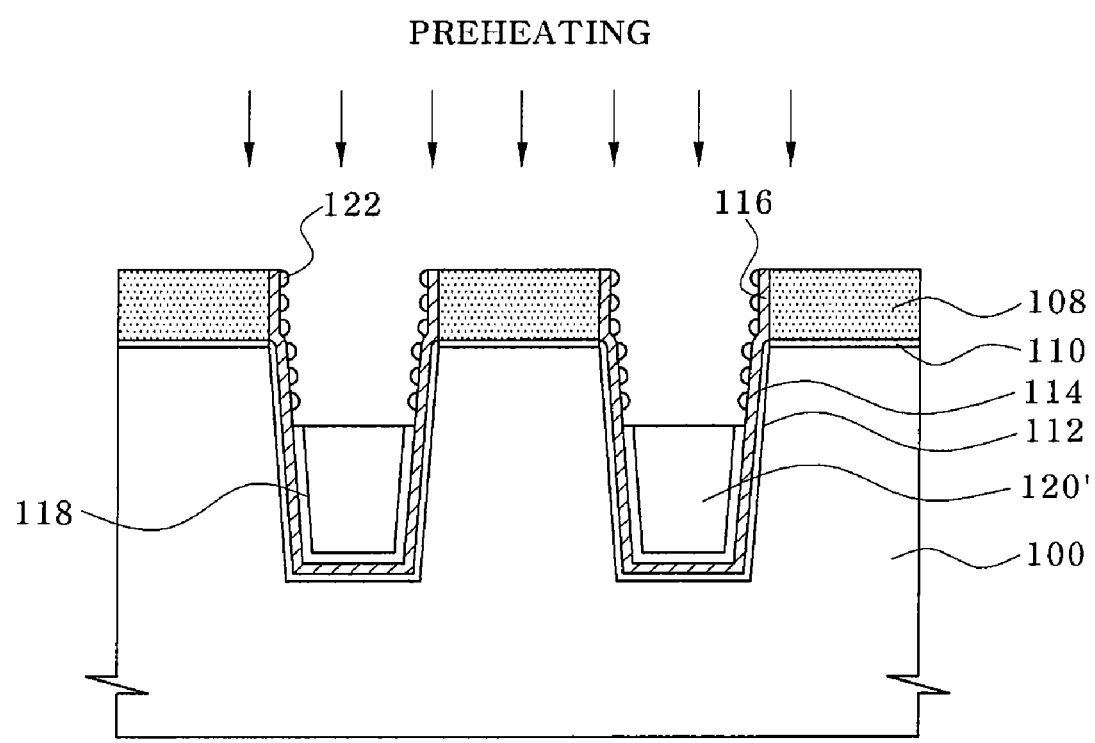
FIGS. 17 through 22 illustrate another embodiment of the invention.

Referring to FIGS. 17 and 13, a preheating process is performed on the semiconductor substrate 100 to release stresses of the sidewall oxide layer 114 and the liner nitride layer 116.

In detail, the semiconductor substrate 100 is loaded on the stage 305 of the HDP chamber 300 shown in FIG. 13. While supplying inert gases including oxygen ($O_2$), argon (Ar), and helium (He) gases to the HDP chamber 300, a predetermined power (or a bias voltage) is supplied to the HDP chamber 300 to form a preheating process. The preheating process is performed for no more than about sixty seconds. The oxygen ($O_2$) may be supplied to the HDP chamber 300 at a flow rate of about 100 sccm to about 120 sccm, and the argon (Ar) gas may be supplied to the HDP chamber 300 at a flow rate of about 40 sccm to about 50 sccm. The helium (He) gas may be supplied to the HDP chamber 300 from the lateral sides 320 at a flow rate of about 200 sccm to about 300 sccm and from the topside 315 at a flow rate of about 200 sccm to about 300 sccm. Further, power ranging from about 4500 W to about 5500 W may be supplied to the HDP chamber 300 from the topside 315, and power ranging from about 3500 W to about 4500 W may be supplied to the HDP chamber 300 from the lateral sides 320 to generate plasma in the HDP chamber 300. No power is supplied to the HDP chamber 300 from a bottom side 325.

Referring to FIGS. 18 and 13, the flowable insulation layer 120' partially fills the trenches 112, and the liner nitride layer 116 is formed on the sidewalls of the trenches 112. In this state, a passivation layer 400 is formed on the flowable insulation layer 120' and the liner nitride layer 116.

In detail, after the preheating process, while supplying an HDP deposition source to the HDP chamber 300, a predetermined power (or a bias voltage) is supplied to the HDP chamber 300 to form the passivation layer 400 to a thickness of about 250 Å to about 350 Å. For example, the passivation layer 400 can have a thickness of about 300 Å. The HDP deposition source includes source gases and helium (He) gas. The source gas includes oxygen ($O_2$) and silane ($SiH_4$) gases. The oxygen ($O_2$) gas may be supplied to the HDP chamber 300 at a flow rate of about 100 sccm to about 115 sccm. The silane ($SiH_4$) gas may be supplied to the HDP chamber 300 from the lateral sides 320 at a flow rate of about 40 sccm to about 55 sccm and from the topside 315 at a flow rate of about 25 sccm to about 35 sccm. The helium (He) gas may be supplied to the HDP chamber 300 from the lateral sides 320 at a flow rate of about 150 sccm to about 250 sccm and from the topside 315 at a flow rate of about 50 sccm to about 150 sccm. Power may be supplied to the HDP chamber 300 from the topside 315 in the range from about 7500 W to about 8500 W, and power may be supplied to the HDP chamber 300 from the lateral sides 320 in the range from about 4500 W to about 5500 W. Furthermore, power may be supplied to the HDP chamber 300 from the bottom side 325 in the range from about 450 W to about 550 W. As a result, the passivation layer 400 can be formed on the flowable insulation layer 120' and the liner nitride layer 116 to a thickness of about 250 Å to about 350 Å. The passivation layer 400 functions as an adhesive layer during a subsequent gap-fill process for filling the remaining portions of the trenches 112 not filled with the flowable insulation layer 120'. In addition, the passivation layer 400 protects the liner nitride layer 116 from an etch gas.

Referring to FIGS. 19 and 13, an HDP deposition source including oxygen ($O_2$), silane ($SiH_4$), and hydrogen ($H_2$) gases are supplied to the HDP chamber 300 to form a third HDP oxide layer 402 on the passivation layer 400 for filling the trenches 112.

In detail, hydrogen ($H_2$), oxygen ($O_2$), and silane ($SiH_4$) gases are supplied to the HDP chamber 300. The oxygen ($O_2$) gas may be supplied to the HDP chamber 300 at a flow rate of about 30 sccm to about 40 sccm, and the silane ($SiH_4$) gas may be supplied to the HDP chamber 300 from the lateral sides 320 at a flow rate of about 10 sccm to about 20 sccm. The hydrogen ($H_2$) gas may be supplied to the HDP chamber 300 from the lateral sides 320 at a flow rate of about 600 sccm to about 800 sccm and from the topside 315 at a flow rate of about 200 sccm to about 300 sccm. Power may be supplied to the HDP chamber 300 in the range from about 8000 W to about 10000 W, and power may be supplied to the HDP chamber 300 from the lateral sides 320 in the range from about 5500 W to about 7000 W. Further, power may be supplied to the HDP chamber 300 from the bottom side 325 in the range from about 3000 W to about 4000 W. As a result, the third HDP oxide layer 402 can be formed on the passivation layer 400 to a thickness of about 1800 Å to about 2200 Å.

In a conventional method, the hydrogen ($H_2$) gas of the HDP deposition source may be supplied at a flow rate of about 120 sccm to about 130 sccm. However, in the current embodiment of the invention, the hydrogen ($H_2$) gas is supplied at a higher flow rate than that of the conventional method. For example, the hydrogen ($H_2$) gas is supplied to the HDP chamber 300 from the lateral sides 320 at a flow rate of about 600 sccm to about 800 sccm and from the topside 315 at a flow rate of about 200 sccm to about 300 sccm. Furthermore, although the silane ($SiH_4$) gas may be supplied at a flow rate of about 25 sccm to about 38 sccm in a conventional method, the silane ($SiH_4$) gas is supplied at a flow rate of about 10 sccm to about 20 sccm in the current embodiment of the invention.

When the silane ($SiH_4$) gas is supplied to the HDP chamber 300 at a low flow rate while the hydrogen ($H_2$) gas is supplied to the HDP chamber 300 at a high flow rate, a deposition rate of an HDP layer by the silane ($SiH_4$) gas is low and a sputtering rate by the hydrogen ($H_2$) gas is high. Therefore, a DSR can range from about 7 to about 10. When the DSR of a deposition process has a low value ranging from about 7 to about 10, a buried insulation layer (or an HDP oxide layer) grows faster on the bottom of the trenches 112 than on the sidewalls of the trenches 112 where the rough portions 122 are formed so that generation of nano voids at the sidewalls of the trenches 112 can be prevented. When a buried insulation layer (or an HDP oxide layer) grows slower in the trenches 112 than on the sidewalls of the trenches 112 where the rough portions 122 are formed, the buried insulation layer may grow on the upper sidewalls of the trenches 112 before the inside portions of the trenches 112 are completely filled with the buried insulation layer. In this case, nano voids are formed. However, in the current embodiment of the invention, the sputtering rate is increased, and the deposition rate is decreased to lower the DSR for restraining the buried insulation layer from growing at the sidewalls of the trenches 112. Therefore, generation of nano voids can be prevented. In addition, a high power (or a bias voltage) is supplied to the HDP chamber 300 when the third HDP oxide layer 402 is formed to increase the temperature of the semiconductor substrate 100 so as to prevent the HDP deposition source from being absorbed on the sidewalls of the trenches 112.

Referring to FIG. 20, as shown by arrows, a high power (or a bias voltage) is supplied to the semiconductor substrate 100. For example, power of about 8000 W to about 10000 W is supplied to the semiconductor substrate 100 from the topside 315 of the HDP chamber 300. Power of about 5500 W to about 7000 W is supplied to the semiconductor substrate 100 from the lateral sides 320 of the HDP chamber 300. Power of about 3000 W to about 4000 W is supplied to the semiconductor substrate 100 from the bottom side 325 of the HDP chamber 300. In this way, the temperature of the semiconductor substrate 100 can be increased to about 650° C. to about 750° C. and kept at that range. When the temperature of the semiconductor substrate 100 increases, an oxide source 410 adsorbed on the sidewalls of the trenches 112 can be released. Therefore, an HDP layer can grow slower at the sidewalls of the trenches 112.

Figure 21:
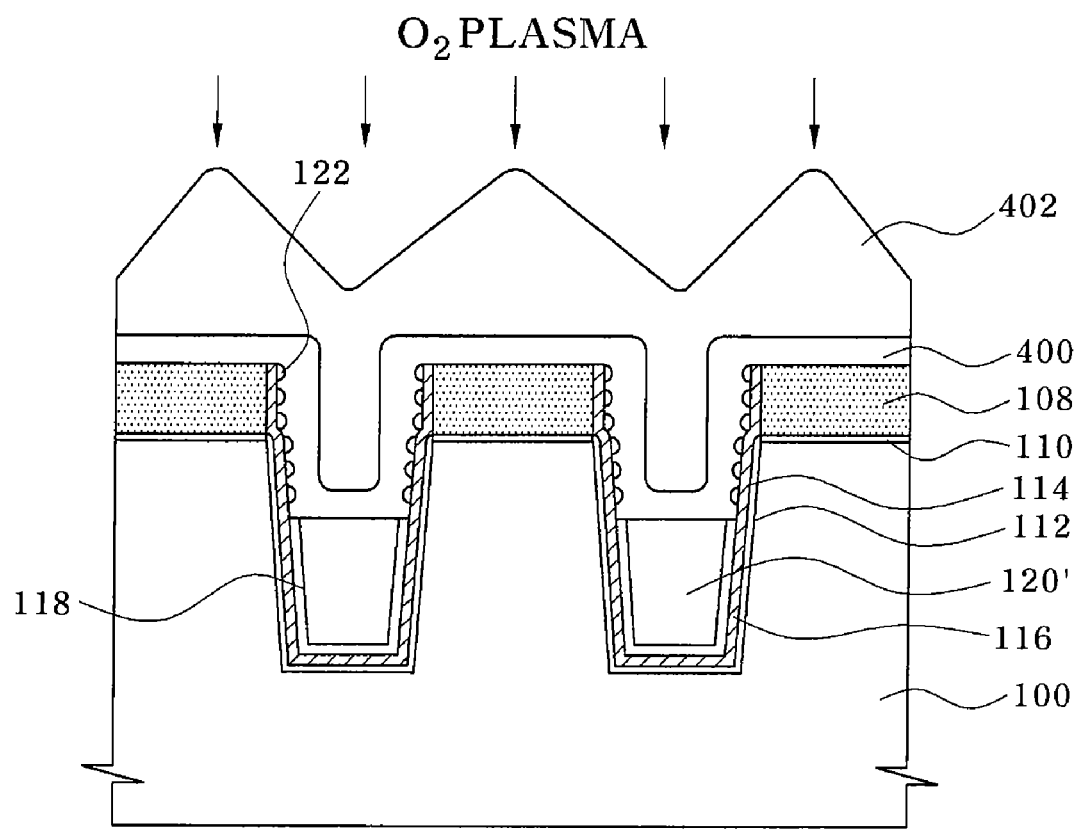

Referring to FIG. 21, oxygen plasma is applied to the semiconductor substrate 100 to remove hydrogen ions from a surface of the third HDP oxide layer 402.

In detail, oxygen ($O_2$) and helium (He) gases are supplied to the HDP chamber 300. Then, a predetermined power is supplied to the HDP chamber 300 to generation oxygen plasma. The oxygen ($O_2$) gas may be supplied to the HDP chamber 300 at a flow rate of about 500 sccm to about 1000 sccm, and the helium (He) gas may be supplied to the HDP chamber 300 at a flow rate of about 50 sccm to about 150 sccm. Power may be supplied to the HDP chamber 300 from the topside 315 in the range from about 5000 W to about 10000 W, and power may be supplied to the HDP chamber 300 from the lateral sides 320 in the range from about 5000 W to about 10000 W. No power is supplied to the HDP chamber 300 from the bottom side 325.

As explained above, a large amount of hydrogen ($H_2$) gas is supplied to form the third HDP oxide layer 402. Thus, many hydrogen ions are contained in the surface of the third HDP oxide layer 402. Therefore, when oxygen plasma is formed in the HDP chamber 300, the hydrogen ions contained in the third HDP oxide layer 402 react with the oxygen plasma, and thus the hydrogen ions can be removed from the third HDP oxide layer 402. In this way, the third HDP oxide layer 402 can be treated. Then, a capping layer (not shown) is formed on the third HDP oxide layer 402. Instead of repeating deposition of an HDP oxide layer and etching of overhangs of the HDP oxide layer to form the third HDP oxide layer 402 in the trenches 112 by, the third HDP oxide layer 402 is formed only by deposition to a thickness of about 1800 Å to about 2200 Å. Although the third HDP oxide layer 402 is formed only by deposition, formation of overhangs on the third HDP oxide layer 402 can be prevented since the growth rate of the third HDP oxide layer 402 can be kept low at the sidewalls of the trenches 112 by supplying the silane ($SiH_4$) gas at a low flow rate and the hydrogen ($H_2$) gas at a high flow rate.

Figure 22:
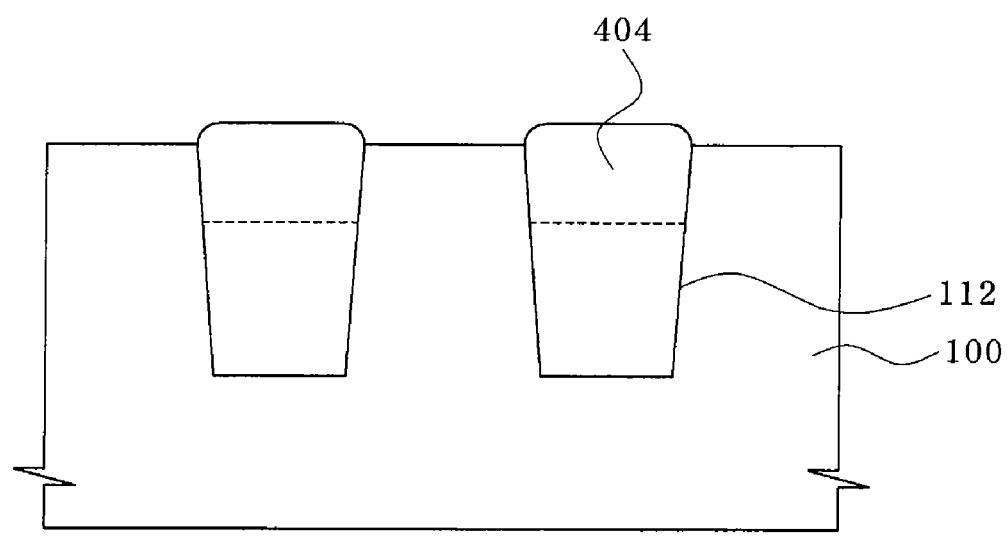
Figure 23A:
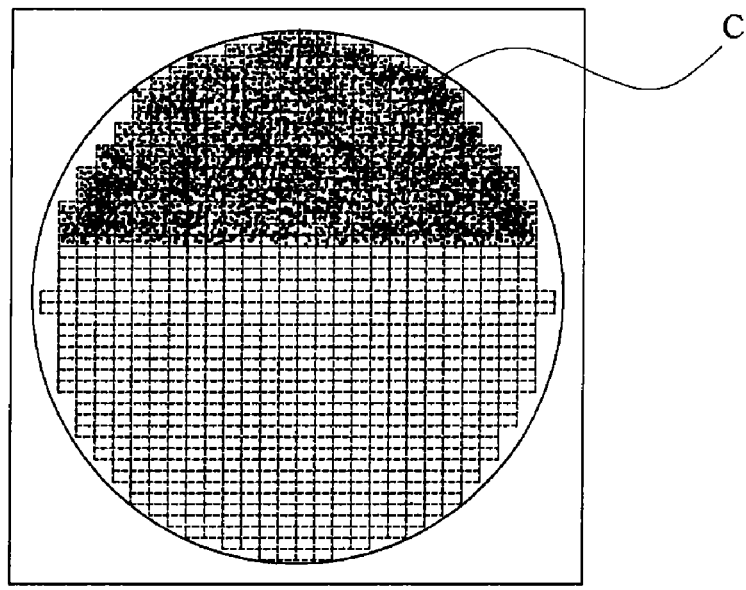
FIGS. 23A and 23B illustrate inspection results of wafers.
Figure 23B:
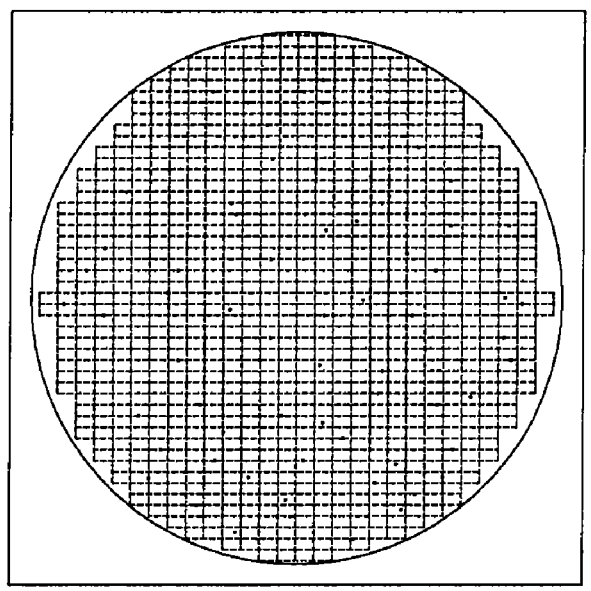

Referring to FIG. 22, a trench isolation layer 404 is formed by performing a predetermined process on the third HDP oxide layer 402. In detail, the capping layer (not shown) and the third HDP oxide layer 402 are planarized until a pad nitride layer pattern 108 is exposed. Then, the exposed pad nitride layer pattern 108 and a pad oxide layer pattern 110 are removed to form the trench isolation layer 404. The capping layer and the third HDP oxide layer 402 can be planarized by CMP.

In the method for forming an isolation layer in a semiconductor device according to the invention, although sidewalls of trenches become rough when the trenches are partially filled, hydrogen ($H_2$) gas is supplied at a low rate to reduce a DSR when an HDP oxide layer is formed in the trenches so that the HDP oxide layer can grow slower at the rough upper sidewalls of the trenches. Alternatively, when an HDP oxide layer is formed in trenches, a DSR can be reduced to reduce the growth rate of the HDP oxide layer at rough upper sidewalls of the trenches by reducing the supply rate of silane ($SiH_4$) gas and increasing the supply rate of hydrogen ($H_2$) gas to increase a sputtering rate relative to a deposition rate. That is, growth rate at the rough upper sidewalls of the trenches can be lowered by decreasing the DSR so that generation of nano voids can be prevented at the sidewalls of the trenches. When landing plugs formed of a conductive material were inspected using an electron beam inspection (EBI) for bridge defects, many bridge defects were detected in a wafer (C) processed by a conventional method as shown in FIG. 23A. However, much fewer bridge defects were detected in a wafer processed according to the current embodiment of the invention as shown in FIG. 23B.

While the invention has been described with respect to the specific embodiments, it will be apparent to those skilled in the art that various changes and modifications may be made without departing from the spirit and scope of the invention as defined in the following claims.

What is claimed is:

1. A method for forming an isolation structure in a semiconductor device, the method comprising:
    forming a trench in a semiconductor substrate;
    forming a liner layer on a sidewall of the trench, wherein the liner layer comprises a liner nitride layer and a liner oxide layer;
    forming a flowable insulation layer to at least substantially fill the trench;
    etching the flowable insulation layer to expose an upper portion of the liner nitride layer in the trench;
    performing a first preheating process by supplying a first preheating gas so as to release stress of the liner layer;
    performing a second preheating process by supplying a second preheating gas so as to oxidize the exposed upper portion of the liner nitride layer;
    forming a passivation layer over the exposed upper portion of the liner nitride layer and the flowable insulation layer, wherein the passivation layer is formed to have a predetermined thickness by using a first deposition source including oxygen ($O_2$), silane ($SiH_4$), and helium (He) gases; and
    forming a buried insulation layer over the passivation layer so as to fill the trench using a second deposition source including oxygen ($O_2$), silane ($SiH_4$), hydrogen ($H_2$), and helium (He) gases, the buried insulation layer being formed while keeping a deposition sputtering rate (DSR) at no more than approximately 22.

2. The method of claim 1, wherein the etching of the flowable insulation layer is performed using a wet etch chemical comprising a hydrofluoric acid (HF).

3. The method of claim 1, wherein the flowable insulation layer is etched to reduce a thickness by approximately 1100 Å to 1400 Å.

4. The method of claim 1, wherein the first preheating gas comprises argon (Ar) and helium (He) gases.

5. The method of claim 1, wherein the second preheating gas comprises oxygen ($O_2$), argon (Ar), and helium (He) gases.

6. The method of claim 1, wherein the first and second preheating processes are completed within sixty seconds.

7. The method of claim 1, wherein the passivation layer is formed to a thickness of approximately 140 Å to 180 Å.

8. The method of claim 1, wherein the forming of the buried insulation layer comprises:
    etching an overhang of the buried insulation layer formed at an upper side of the trench; and
    depositing an additional buried insulation layer by supplying the second deposition source.

9. The method of claim 8, wherein the etching of the overhang, the depositing of the buried insulation layer and the depositing of the additional buried insulation layer are repeated up to three times.

10. The method of claim 1, further comprising:
    loading the semiconductor substrate into a chamber, wherein the depositing of the buried insulation layer is performed by supplying the silane ($SiH_4$) gas to the chamber from a lateral side of the chamber at a flow rate of approximately 25 sccm to 38 sccm and from a top side of the chamber at a flow rate of approximately 15 sccm to 25 sccm, and supplying the hydrogen ($H_2$) gas to the chamber at a flow rate of no more than approximately 40 sccm.

11. A method for forming an isolation structure in a semiconductor device, the method comprising:
    forming a trench in a semiconductor substrate;
    forming a liner layer on a surface of the trench, wherein the liner layer comprises a liner nitride layer and a liner oxide layer;
    forming a flowable insulation layer to at least substantially fill the trench;
    etching the flowable insulation layer to expose an upper portion of the liner nitride layer in the trench;
    performing a first preheating process by supplying a first preheating gas so as to release stress of the liner layer;
    performing a second preheating process by supplying a second preheating gas so as to oxidize the exposed upper portion of the liner nitride layer;
    forming a passivation layer over the exposed upper portion of the liner nitride layer and the flowable insulation layer, wherein the passivation layer is formed to have a predetermined thickness by supplying a first deposition source including oxygen ($O_2$), silane ($SiH_4$), and helium (He) gases; and
    depositing a buried insulation layer over the passivation layer so as to at least substantially fill the trench to form an isolation structure, the buried insulation layer being deposited by supplying a second deposition source including oxygen ($O_2$), silane ($SiH_4$), and hydrogen ($H_2$) gases while keeping a deposition sputtering rate (DSR) at no more than approximately 7.

12. The method of claim 11, wherein after the depositing of the buried insulation layer, the method further comprises applying oxygen ($O_2$) plasma to the semiconductor substrate so as to remove hydrogen from a surface of the buried insulation layer by reacting oxygen ions with hydrogen ions.

13. The method of claim 11, wherein the etching of the flowable insulation layer is performed using a wet etch chemical comprising a hydrofluoric acid (HF).

14. The method of claim 11, wherein the flowable insulation layer is etched to reduce a thickness by approximately 1100 Å to 1400 Å.

15. The method of claim 11, wherein the passivation layer is formed to a thickness of approximately 250 Å to 350 Å so as to protect the liner nitride layer when the buried insulation layer is deposited.

16. The method of claim 11, further comprising:
    loading the semiconductor substrate into a chamber, wherein the depositing of the buried insulation layer is performed by supplying the silane ($SiH_4$) gas to the chamber at a flow rate of about 10 sccm to about 20 sccm, and supplying the hydrogen ($H_2$) gas to the chamber from a lateral side of the chamber at a flow rate of about 600 sccm to about 800 sccm and from a topside of the chamber at a flow rate of about 200 sccm to about 300 sccm while maintaining the semiconductor substrate at a temperature of about 650° C. to about 750° C.

* * * * *